United States Patent
Toyoda et al.

(10) Patent No.: US 8,855,148 B2
(45) Date of Patent: Oct. 7, 2014

(54) MULTIPLEXING TRANSMISSION SYSTEM, RECEIVER APPARATUS AND MODULE, TRANSMITTER APPARATUS FOR MULTIPLEXING TRANSMISSION

(75) Inventors: Hidehiro Toyoda, Yokohama (JP); Masashi Kono, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 119 days.

(21) Appl. No.: 13/586,076

(22) Filed: Aug. 15, 2012

(65) Prior Publication Data

US 2013/0064115 A1 Mar. 14, 2013

(30) Foreign Application Priority Data

Sep. 13, 2011 (JP) ................. 2011-199911

(51) Int. Cl.
- *H04J 3/02* (2006.01)
- *H04L 29/04* (2006.01)
- *H04L 12/26* (2006.01)
- *H04B 1/00* (2006.01)
- *H03K 17/00* (2006.01)
- *H04J 3/00* (2006.01)

(52) U.S. Cl.
CPC ............. *H04L 12/26* (2013.01); *H04L 29/04* (2013.01); *H04B 1/00* (2013.01); *H03K 17/00* (2013.01); *H04J 3/00* (2013.01)
USPC ........................................... 370/538

(58) Field of Classification Search
CPC ............. H04J 3/02; H04J 3/04; H04L 29/04
USPC .............. 370/252, 532–545; 375/240.27
See application file for complete search history.

(56) References Cited

U.S. PATENT DOCUMENTS

| 8,369,341 B2 * | 2/2013 | Baba et al. ............... 370/395.42 |
| 2005/0185679 A1 * | 8/2005 | Sangawa et al. ............. 370/536 |
| 2012/0039398 A1 * | 2/2012 | Kang et al. ............... 375/240.27 |

FOREIGN PATENT DOCUMENTS

JP 2000-252942 9/2000

OTHER PUBLICATIONS

Part 3: Carrier sense multiple access with Collision Detection (CSMA/CD) Access Method and Physical Layer Specifications; IEEE Standard 802.3—2008 (Revision of IEEE Std 802.3-2005); pp. 55-58.

Zhuang Zichao; Design and Implementation of Simulcrypt Scrambling System and Off-line Analysis Software; Jan. 8, 2010; pp. I, 11-12, 23-48 (with partial English translation).

* cited by examiner

*Primary Examiner* — Albert T Chou
(74) *Attorney, Agent, or Firm* — Foley & Lardner LLP

(57) ABSTRACT

Digital signals having respective pieces of frequency information different from each other are bundled, and transmitted at high speed. On receiving side, digital signals retaining the respective pieces of frequency information are recovered and separated. Transmitter apparatus divides pieces of transmission data that have the different pieces of frequency information and correspond to respective input channels into data blocks having a fixed length, as valid data, and subsequently multiplexes the data blocks corresponding to the respective input channels and outputs the multiplexed data to a transmission path. A receiver apparatus divides data string received into data flows and subsequently restores the transmission data, from the data blocks consecutive in each data flow and stores the restored data, and outputs transmission data corresponding to the respective data flows in synchronization with clocks generated for these data flows.

10 Claims, 13 Drawing Sheets

(1) Case of valid data (2) Case of invalid data

MULTIPLEXING TRANSMISSION SYSTEM, RECEIVER APPARATUS AND MODULE, TRANSMITTER APPARATUS FOR MULTIPLEXING TRANSMISSION

CLAIM OF PRIORITY

The present application claims priority from Japanese patent application JP 2011-199911 filed on Sep. 13, 2011, the content of which is hereby incorporated by reference into this application.

BACKGROUND OF THE INVENTION

1. Field of the Invention

The present invention relates to multiplexing transmission that transmits data via a transmission path.

2. Background Art

In recent years, many high speed serial data signals have been used in fields of mutually connecting LSIs and PCBs (printed circuit boards) that configure an information processing apparatus. In general, electric data signals are used for short distance transmission having a signal transmission distance equal to or less than several centimeters; optical data signals are used for long distance transmission having a signal transmission distance at least one meter. As signal transmission rates increase, the distance allowing transmission by electric data signals tends to be shorter and shorter. For instance, as a PCB that uniformizes wirings connecting PCBs to each other in an information processing apparatus (what is called a backplane PCB) has had an improved transmission rate of 10 Gbps or more, signals to be used for transmission has started to shift from electric data signals, which are difficult to transmit over a long distance, to optical data signals, which allow stable transmission.

The rate of transmission by optical data signals can be increased in comparison with the rate of transmission of electric data signals. Accordingly, the need intensifies for multiplexing many electric data signals on a PCB into a small number of optical data signals and transmitting the multiplexed signals. Thus, various techniques for multiplexing signals have been developed.

FIG. 1 shows a conventional multiplexer and de-multiplexer. A multiplexer circuit (the left in the drawing) used in this conventional circuit is required to operate in following conditions.

(1) Immediately before input into a multiplexer disposed at a final stage, all the data rates (X1 bps, . . . , Xn bps) of n inputs (TxP1, . . . , TxPn) are equal to each other. That is, X1=X2= . . . =Xn.

(2) The phases of all the pieces of bit data are the same as each other.

(3) The data rate of an output of the multiplexer is equal to the sum of the data rates of all the inputs. That is, Y=X1×n.

In general, a multiplexer circuit performs a process of converting a low speed parallel data signal (synchronization signals having the same speed and the same phase on all channels) into a high speed serial data signal. However, the conventional circuit shown in FIG. 1 does not have a mechanism ensuring that the number of an output channel of a de-multiplexer configuring a de-multiplexer circuit (the right in the drawing) coincides with the number of an input channel of a multiplexer circuit.

This type of mechanism is disclosed in JP Patent Publication (Kokai) No. 2000-252942 A. A multiplexer and de-multiplexer described in JP Patent Publication (Kokai) No. 2000-252942 A relates to a multiplexing process (specifically, SONET/SDH protocol) technique on optical data signals. A multiplexer circuit multiplexes low speed optical data signals to generate a high speed optical data signal, and a de-multiplexer circuit separates the high speed optical data signal to recover the initial low speed optical data signals.

FIG. 2 shows a configuration of a multiplexer and de-multiplexer circuit having a synchronization circuit disclosed in JP Patent Publication (Kokai) No. 2000-252942 A. A multiplexer circuit (the left in the drawing) shown in FIG. 2 terminates a specified protocol of only one channel among n+1 channels, and inserts a special pattern into the channel. The input, into which the special pattern has been inserted, is multiplexed by a (n+1):1 multiplexer into the other n inputs (TxP1, . . . , TxPn). That is, reframing is performed. In the drawing, a circuit used for generating the special pattern is denoted as a pattern generator.

Meanwhile, a de-multiplexer circuit (the right in the drawing) shown in FIG. 2 performs a special pattern synchronization process on a specified channel among separated n+1 channels. In the drawing, a circuit used for the special pattern synchronization is denoted as a pattern synchronizer. Through the synchronization process, the de-multiplexer circuit detects the leading position from which a 1:(n+1) de-multiplexer separates the multiplexed signal. Adoption of this mechanism allows the multiplexer and de-multiplexer shown in FIG. 2 to ensure the matching relationship between the numbers of the input channel and the output channel (hereinafter, the position of channel).

In the case of the circuit shown in FIG. 1, it is required to temporarily terminate the protocols of all the channels and concatenate data to multiplex the data. The circuit shown in FIG. 2 can keep the termination of the protocol to be only one channel. Accordingly, the apparatus of the circuit shown in FIG. 2 can be reduced in scale in comparison with the circuit shown in FIG. 1.

There is another method that temporally multiplexes packet data or frame data corresponding to inputs having different data rates and transmits the multiplexed data. A typical conventional art is a frame multiplexing apparatus standardized by the IEEE802 Committee (IEEE Std 802.3-2008). This frame multiplexing temporarily stores the frames of the channels having different data rates in a buffer, and subsequently reads the frames at the rate of an output channel, thereby realizing a multiplexing process on the channels having different data rates.

As described above, data transmission executed in an apparatus is required to handle many transmission channels. Accordingly, the apparatus and LSIs related to the data transmission are specifically required to be downsized.

However, in this type of use, the data rates of input channels to be multiplexed vary according to use situations. Accordingly, it is difficult to synchronize the data rates of all the channels input into the multiplexer. Furthermore, the data rates of the channels output from the de-multiplexer are required to completely coincide with the data rate of the respective corresponding input channels on the multiplexer side, in order to realize complete data transmission independent of the content of data to be transmitted on each channel without data loss. Thus, a realization method satisfying these conditions is required.

However, the multiplexer and de-multiplexer (FIG. 2) disclosed in JP Patent Publication (Kokai) No. 2000-252942 A cannot satisfy the conditions. This is because the circuit shown in FIG. 2 assumes that the rates of input channels are the same and realizes a multiplexing process on optical data signals by a simple multiplexer. That is, this is because the circuit configuration shown in FIG. 2 is incapable of multiplexing inputs having different data rates. Even if a process of terminating the SONET/SDH protocol is executed on a single channel, the required circuit scale is large. This is unsuitable for downsizing LSIs.

In contrast, a frame multiplexing apparatus disclosed in IEEE Std 802.3-2008 is capable of a multiplexing process of channels having different data rates.

However, the apparatus of IEEE Std 802.3-2008 is also incapable of causing the data rates of the input channel and the data rate of the output channel to completely coincide with each other. This is because accommodation of the difference between the data rates by framing loses clock information (clock frequency, frequency jitter, etc.) included in data on each channel at the time of input into the multiplexer. Furthermore, the apparatus of IEEE Std 802.3-2008 assigns destinations in units of frames and executes a process of dividing data according to the destinations, in order to ensure data transmission between the input channels and the output channels. This necessitates a process of searching for a destination for dividing data and a process of storing data for preventing data congestion. This fact means that the processing time required for data transmission cannot be strictly ensured. The aforementioned process requires a much larger circuit than that of the apparatus of JP Patent Publication (Kokai) No. 2000-252942 A. Accordingly, this process is very unsuitable for downsizing LSIs.

Furthermore, the invention disclosed in JP Patent Publication (Kokai) No. 2000-252942 A and the invention disclosed in IEEE Std 802.3-2008 cannot be combined together. This is because the apparatus of JP Patent Publication (Kokai) No. 2000-252942 A assumes that the input rates of channels be the same and multiplexes data on the channels. In contrast, the apparatus of IEEE Std 802.3-2008 is required to temporarily terminate the protocols of all channels and subsequently capture frames and execute a multiplexing process. Accordingly, an apparatus combining both the inventions leads to a result of losing an advantageous effect (reduction in apparatus scale) due to only one channel being terminated in JP Patent Publication (Kokai) No. 2000-252942 A. Even if both inventions are combined together, the data rate of the input channel and the data rate of the output channel cannot coincide with each other. Accordingly, the problem of IEEE Std 802.3-2008 cannot be solved.

SUMMARY OF THE INVENTION

In view of the technical problems, it is an object of the present invention to realize multiplexing transmission technique that can multiplex data signals (e.g., digital signals that are generated according to clock sources and have different frequency errors and/or different jitter characteristics, and/or digital signals having different bit rates) having different frequency information and transmits the multiplexed signals and, on the receiving side, separate and recover the digital signals while retaining frequency information at the time of multiplexing the digital signals.

Thus, the present inventor proposes a data multiplexer system including a transmitter apparatus and a receiver apparatus (including a receiver module) that have a following processing function.

The transmitter apparatus includes: (A1) a plurality of input channels, each of which is capable of receiving transmission data having frequency information different from frequency information of the other input channels; (A2) a plurality of block divider that divide transmission data corresponding to the respective input channels into data blocks having a fixed length, as valid data; and (A3) a multiplexer that multiplexes the data blocks corresponding to the respective input channels and outputs multiplexed data to the transmission path.

The receiver apparatus includes: (B1) a de-multiplexer that divides a data string received via the transmission path into as many data flows as the input channels on a side of the transmitter apparatus; (B2) a plurality of FIFOs that execute a process of restoring valid data from the corresponding data flows and storing the data in respective FIFO memories, and a process of reading the transmission data from the respective FIFO memories and outputting the data to the corresponding output channels; and (B3) a plurality of frequency controllers that execute a process of estimating transmission data rates from time average data rates of the respective corresponding data flow, and a process of adjusting the frequencies of clocks supplied to the corresponding FIFOs so as to be equal to the respective estimated transmission data rates.

According to the present invention, the transmitter apparatus is capable of multiplexing the data strings on the respective input channels, while retaining the pieces of frequency information of the pieces of transmission data on the respective channels. In an analogous manner, the receiver apparatus captures the pieces of frequency information specific to the respective data flows and separately adjusts the frequencies of the clocks when separating the pieces of data from the respective data flows. This allows matching to be ensured between the data rates on the input channel and the output channel. Objects, configurations and advantageous effects other than those described above will become apparent according to the following description on embodiments.

DETAILED DESCRIPTION OF THE PREFERRED EMBODIMENTS

Figure 1:
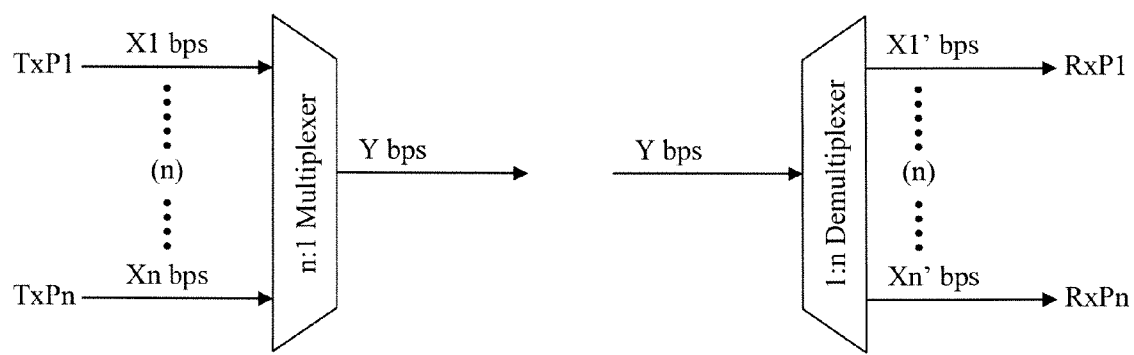
FIG. 1 is a diagram showing a multiplexer and de-multiplexer including a typical multiplexer circuit and a de-multiplexer circuit.
Figure 2:
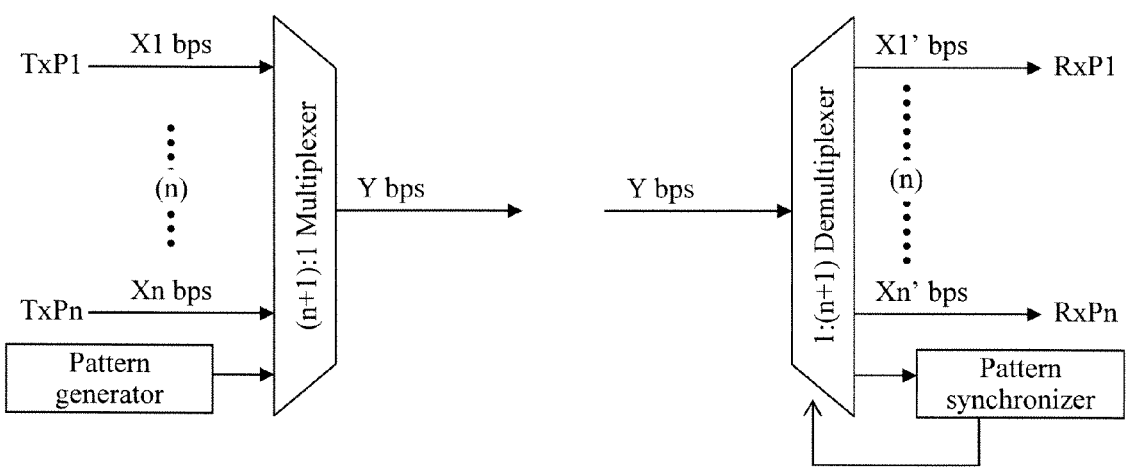
FIG. 2 is a diagram showing a multiplexer and de-multiplexer including a multiplexer and a de-multiplexer shown in JP Patent Publication (Kokai) No. 2000-252942 A.

In the following description, the present invention will be divided into examples of modes and embodiments and described, as necessary for the sake of convenience. Without particularly specified, the examples and embodiments are not irrelevant to each other. There may be relationship where one is a variation, an application, detailed description, supplementary description or the like of a part or the entire parts of the others. In the following examples of modes and embodiments, when referring to the number of elements and the like (including the number of pieces, a numerical value, amount, range, etc.), except for the case of being particularly specified and the case of being limited to the specified number according to the principle, the specified number imposes no limitation. The number may be more than or less than the specified number.

Furthermore, in the following examples of modes and embodiments, the configurational elements (including element steps etc.) are not necessarily required, except for the case of being particularly specified and the case where it can be considered that it is necessary according to the principle. Likewise, in the following examples of modes and embodiments, when the aforementioned number and the like (including the number of pieces, value, amount, range, etc.) are referred to, what is substantially analogous or similar to the number and the like is included, except for the case of being particularly specified and the case where this is not apparently applied.

Examples of modes and embodiments of the present invention will hereinafter be described in detail with respect to drawings. In all the drawings for illustrating the examples of modes and embodiments, identical or related symbols are assigned to components having the same function. Repetitive description thereof is omitted. In the following examples of modes and embodiments, the description on the same or analogous parts is not repeated in principle without being specifically required.

A. Example of Mode

[Overall Configuration]

First, the conceptual configuration of a data multiplexer system common to the embodiments will be described. A data multiplexer system includes a transmitter apparatus and a receiver apparatus. The transmitter apparatus includes n CDRs (clock and data recovery), n FIFOs (first-in-first-out buffers), n block framers (block framers), a pattern generator, a multiplexer, a clock source for an input stage, a PLL for the input stage, a clock source for an output stage, and a PLL for the output stage. The receiver apparatus includes a clock source for an input stage, a PLL for the input stage, a CDR, a clock divider, a de-multiplexer, a pattern synchronizer, n block de-framers, n FIFOs, a clock source for an output stage, n PLLs, and n frequency controllers.

[Configuration of Transmitter Apparatus]

The transmitter apparatus receives n data signals. The n data signals may have frequency information different from each other, or frequency information identical to each other. It is unnecessary that all the n data signals have different frequency information. Instead, it is sufficient that any of the signals has frequency information different from that of the other data signal. Such data signals include, for instance, data signals generated according to clock sources having different frequency errors, digital signals generated according to clock sources having different jitter characteristics, and digital signals having different bit rates.

The n data signal channels are input into the respective corresponding CDRs. Thus, the number of CDRs is n. Each CDR extracts a clock component from the input data signal, recovers a recovered clock synchronized with the data signal and bit data synchronized with this clock on the basis of a high frequency clock supplied from the corresponding PLL. The bit data and the recovered clock are transmitted from the CDR to the FIFO.

The n clock sources for the input stage generate reference clocks having unique frequencies, and supply the clocks to the respective n CDRs. The n PLLs for the input stage generate clocks having a frequency exactly constant times the frequency of the reference clocks supplied from the clock sources, to the respective corresponding CDRs.

The n FIFOs receive the bit data and the recovered clocks from the respective corresponding CDRs, and stores bit data strings in internal FIFO (first in first out) memories in synchronization with the recovered clocks. The FIFOs read the bit data strings stored in the FIFO memories in synchronization with the recovered clocks supplied from the CDRs, and transmit the strings to the respective corresponding block framers. When the FIFO memory does not store data, the FIFO notifies the block framer that the FIFO memory is in an empty state. Meanwhile, when the FIFO memory is full, the FIFO notifies the block framer that the FIFO memory is full. The clocks used by the n FIFO memories during readout are synchronized with the clock commonly supplied from the PLL for the output stage.

The n block framers read data stored in the respective FIFOs and divide the data into blocks having a certain size. Each block framer adds a header identifier (e.g., "10"/"01"), according to which a valid or invalid status of the block data can be determined, to a payload, on the basis of the notification of whether the FIFO memory is in the empty state or the full state, and stores the data. Each block framer transmits the block data having the valid or invalid data to the multiplexer. The pattern generator generates a data string having a fixed pattern at a prescribed cycle, and transmits the string to the multiplexer. The multiplexer temporally multiplexes bit strings received from the n block framers and the pattern generator on a bit-by-bit basis, and outputs a serial bit string that is (n+1) times faster.

[Configuration of Receiver Apparatus]

Received Data in the form of a serial bit string is input into the receiver apparatus. The received data is input into the CDR. The CDR extracts a clock component from the input received data, while recovering a recovered clock synchronized with the data signal and bit data synchronized with the clock on the basis of the high frequency clock supplied from the PLL. The CDR transmits the recovered clock to the divider and the de-multiplexer, and transmits the recovered data to the de-multiplexer. Here, the PLL refers to the clock received from the clock source, and generates a clock having a frequency exactly constant times the frequency of the clocks. The clock divider generates a divided clock that is obtained by precisely dividing the recovered clock by a factor n+1, and distributes the generated divided clock to the de-multiplexer, all the block de-framers, all the FIFOs, and the pattern synchronizer.

The de-multiplexer receives a high frequency recovered clock supplied from the CDR, and receives a low frequency recovered clock from the clock divider. The de-multiplexer uses the two recovered clocks to convert the recovered data in the serial form into that in a parallel form. Here, the de-multiplexer captures the bit data on a bit-by-bit basis according to the received order. The capturing position can be changed. The capturing position is supplied from the pattern synchronizer. The de-multiplexer converts the recovered data into n data signals and one patterned signal. The n block de-framers and the one pattern synchronizer are connected to the de-multiplexer.

The pattern synchronizer receives the bit data captured by the de-multiplexer at intervals of n+1 bits. The pattern synchronizer verifies correlation between the bit data and the specific pattern generated by the pattern generator of the transmitter apparatus. In the case where the correlation between the data string being currently received and the specific pattern is significantly low, the pattern synchronizer issues an instruction of shifting the capturing position in the de-multiplexer by one bit and verifies the correlation again. In this case, if the correlation between data strings is verified for at least a prescribed time, the capturing position in the de-multiplexer is fixed.

The n block de-framers only captures bit data in a block having information indicating validness (valid block) from the block sequence input from the de-multiplexer, and outputs the data to the respective corresponding FIFOs. More specifically, the block de-framer finds the header identifier ("10"/"01") defined by the block format, and determines that the position is a boundary of the block format. The block de-framer extracts only the payload in the block having the header identifier indicating validness, and transmits the payload to the FIFO on the following stage.

The FIFO stores the valid data received from the block de-framer in the internal FIFO memory. The FIFO sequentially reads the data stored in the FIFO memory according to the clock supplied from the PLL. When the rate of writing the valid data is equal to the rate of reading the stored data, increase and decrease of the amount of stored data are averaged to zero. In this case, the FIFO is in a normal state. In contrast, the rate of writing the valid data is higher than the rate of reading the stored data, the FIFO memory runs out of space. In this case, the FIFO becomes an overflow state (hereinafter, also referred to as "OF"). Meanwhile, the rate of writing the valid data is less than the rate of reading the stored data, data shortage occurs. In this case, the FIFO becomes an underflow (hereinafter, also referred to a "UF") state. The FIFO notifies the frequency controller of status information indicating OF or UF and the current remaining amount of stored data.

The clock source generates a reference clock that is the unique frequency. The PLL generates a high frequency clock having a frequency that is obtained by multiplying the frequency of the reference clock received from the clock source by the number of divisions notified from the frequency controller. The frequency controller monitors the state of the FIFO memory in the FIFO (OF, UF, the remaining amount of stored data), and controls the frequency of the clock generated in the PLL such that the FIFO normally operates (overflow or underflow does not occur). The frequency controller designates the division ratio for controlling the frequency of the high frequency clock to be generated in the PLL by means of a real number.

[Realized Advantageous Effects]

The transmitter apparatus adds the identifier indicating validness to the block data received from each input channel, while, if the data rate is insufficient for the output band, inserting a block data to which an identifier indicating invalidness is added. Subsequently, the transmitter apparatus multiplexes the data strings for transmission that retain frequency information. Accordingly, the multiplexed data is created while the frequency information of each channel is retained.

When the receiver apparatus separates the received multiplexed data, this apparatus captures the frequency information (time average data rate) specific to each channel on the basis of the rate of generating valid blocks on each channel and causes the PLL circuit to recover a clock for reading that has the frequency identical to the frequency concerned. This allows the matching between the data rate on the output channel and the data rate on the input channel to be ensured.

The frequency information is dealt with on each channel. Accordingly, also on the receiving side, the data rate on the output channel can be set on a channel-by-channel basis. That is, adoption of the aforementioned configuration allows the multiplexing process with different data rates to be realized.

The internal operations of the transmitter apparatus and the receiver apparatus are not affected by the content of data to be transmitted and the protocol. Accordingly, the processing time required for data transmission on the input channel and data transmission on the output channel can be strictly ensured. This simultaneously allows delay in transmission time to be suppressed.

As described above, use of the transmitter apparatus and the receiver apparatus proposed in this specification can realize a multiplexer apparatus capable of the processes that multiplex digital signals generated according to the clock source signals having different frequency errors and different jitter characteristics and further having different bit rates, and separate and recover the multiplexed signal. Furthermore, this allows the processing apparatus and LSIs that bundle many transmission channels to be reduced in scale.

B. Embodiment 1

A data multiplexer system according to Embodiment 1 will hereinafter be described.

[Configuration of Transmitter Apparatus]

Figure 3:
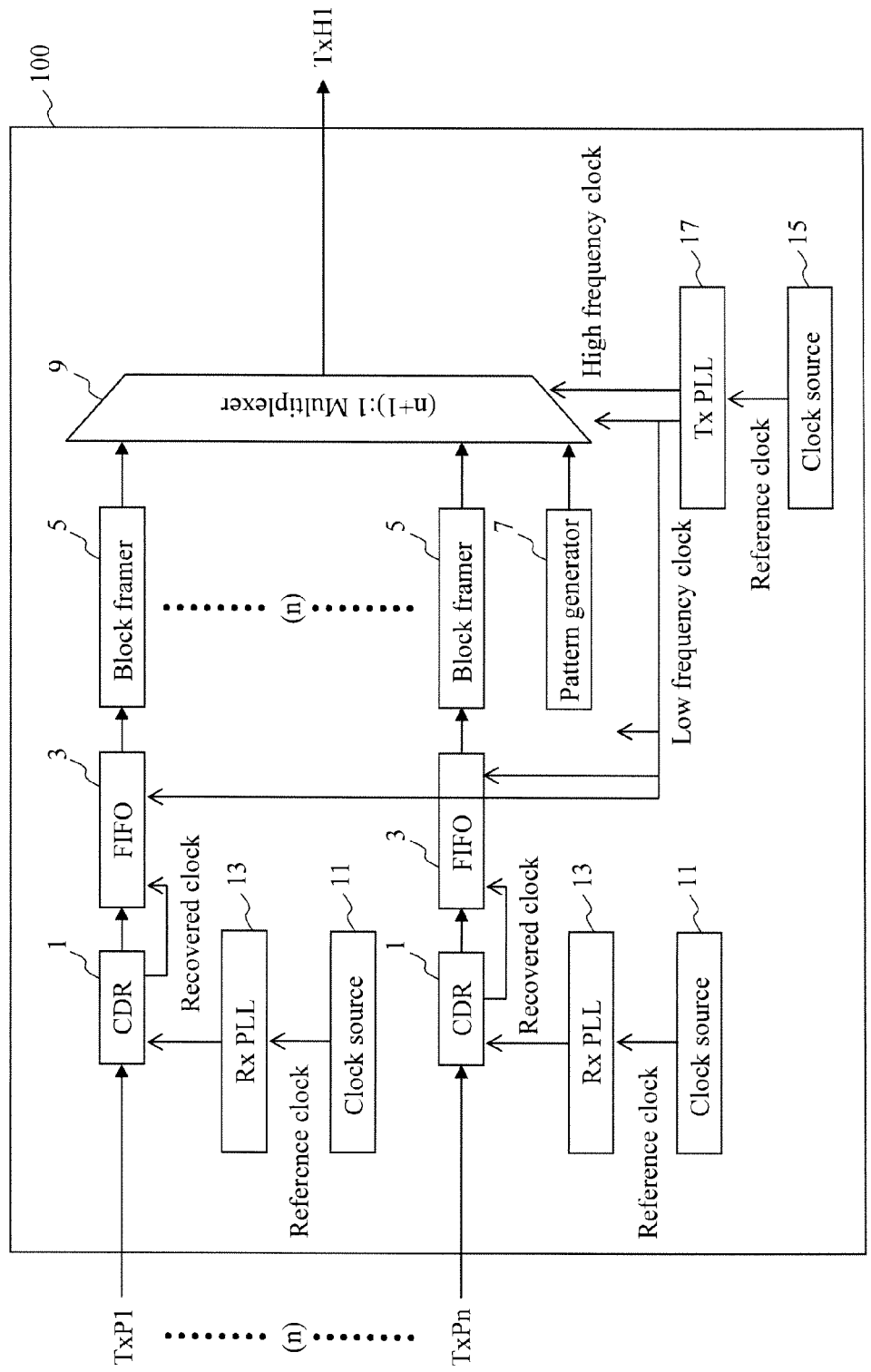
FIG. 3 is a diagram showing an example of a configuration of a multiplexer circuit (transmitter apparatus) according to Embodiment 1.

FIG. 3 shows a functional configuration of a transmitter apparatus 100 according to this embodiment.

The transmitter apparatus 100 includes n input channels (TxP1, . . . , TxPn), n CDRs 1, n FIFOs 3, n block framers 5, a pattern generator 7, a multiplexer 9, a clock source 11, a PLL 13, a clock source 15, a PLL 17, and a single output channel (TxH1).

[Operation of Transmitter Apparatus]

(a) Overview

First, an overview of data processing executed by the transmitter apparatus 100 will be described.

Serial data signals are input into the transmitter apparatus 100 from n input channels (TxP1, . . . , TxPn). These data signals may have data rates whose original clocks are different from each other, or have a data rate completely synchronized with one clock. The serial data signals are input into CDRs 1 corresponding to the respective channels. The processes thereafter are executed independently on each of the n data signals.

The data signal output from the CDR 1 is sequentially processed by the FIFO 3 and the block framer 5. The data signals independently processed by up to the n block framers 5 are input into the multiplexer 9 at respective independent timings. The multiplexer 9 temporally multiplexes the n data signals and the synchronization pattern generated by the pattern generator 7 on a bit-by-bit basis, and outputs the multiplexed signal to a high speed output channel (TxH1).

(b) Detail

Hereinafter, processing operations executed in components configuring the transmitter apparatus 100 will sequentially be described in detail.

The CDR 1 extracts a clock component from the input serial data signal. The CDR 1 operates on the basis of the high frequency clock supplied from the PLL 13 to recover a recovered clock synchronized with the serial data signal and bit data synchronized with this clock. The recovered bit data and the recovered clock are supplied to the FIFO 3.

The clock source 11 is a circuit that generates a clock having a natural frequency. This frequency is typically set to a frequency that is acquired by dividing, by a constant, the frequency of the data rate of the serial data signal assumed to be received by the CDR 1.

The PLL 13 is a circuit generating a clock having a frequency exactly constant times the frequency of the reference clock received from the clock source 11. In this embodiment, the PLL 13 and the clock source 11 are provided for each channel corresponding to the serial data signal to be input. However, a configuration provided with only a single uniformed pair of PLL and the clock source may be adopted.

The FIFO 3 receives the bit data and the recovered clock from the CDR 1, and stores the data string in the internal FIFO (first in first out) memory in synchronization with the recovered clock. The FIFO 3 sequentially reads the data string stored in the FIFO memory in synchronization with the clock supplied from the PLL 17, and transmits the string to the block framer 5.

During the readout, if no data is stored in the FIFO memory, the FIFO 3 issues "FIFO empty state" notification to the block framer 5. Meanwhile, if the FIFO memory is filled with data, the FIFO 3 issues "FIFO full state" notification to the block framer 5. The clock used during readout is common to all the n block framers 5, and required to be synchronized with the clock supplied from the PLL 17.

Figure 4:
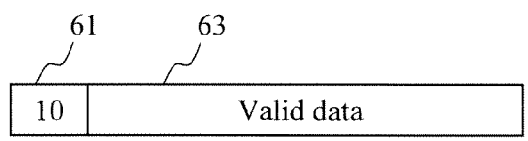
FIG. 4 is a diagram showing an example of a data format used in Embodiment 1.
Figure 4:
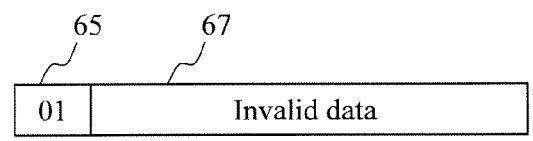
Figure 5:
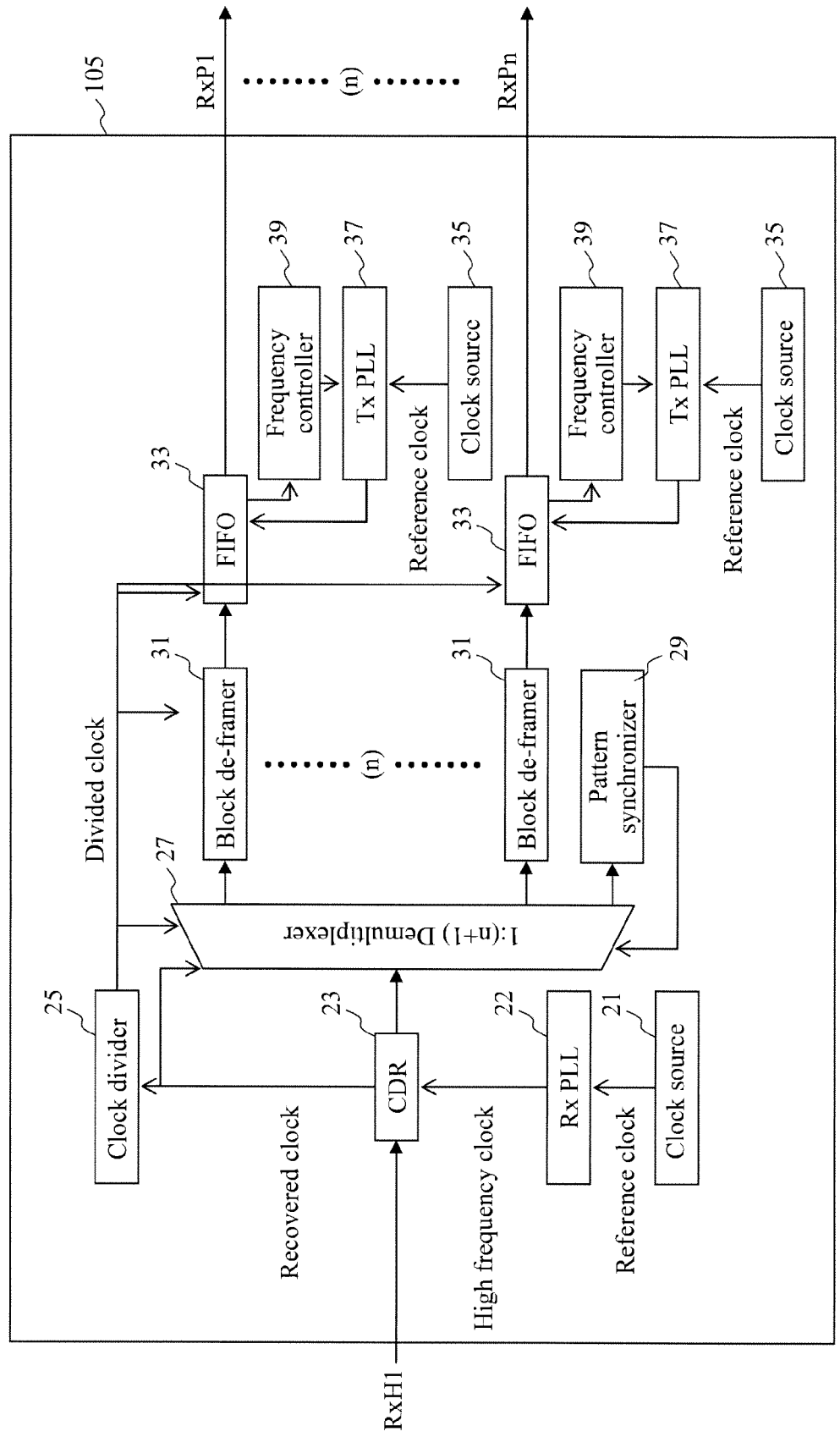
FIG. 5 is a diagram showing an example of a configuration of a de-multiplexer circuit (receiver apparatus) according to Embodiment 1.

The block framer 5 sequentially reads the data stored in the FIFO 3, and then divides the data into blocks having a prescribed size and stores the blocks in the internal memory. Subsequently, the block framer 5 reads the blocks having the prescribed size from the internal memory, and transmits the blocks to the multiplexer 9. FIG. 4 shows a data format of the block used by the block framer 5 and the block de-framer 31 (FIG. 5).

If the block framer 5 normally reads the data during readout from the FIFO 3, this framer adds an identifier having a value "10" and indicating valid data to the head 61 of the block, and stores the data in the payload 63. If the block framer 5 receives the "FIFO empty state" notification from the FIFO 3, this framer cannot read data from the FIFO 3. Accordingly, this framer adds the identifier "01" indicating invalid data to the head 65 of the block, and stores an invalid data string in the payload 67. It is preferred that the block framer 5 perform a data scramble process on the data string stored in the payload. This allows the DC balance and run length of transmission data to be ensured.

The pattern generator 7 generates a data string having a fixed pattern at a prescribed cycle. It is required that this data string be identifiable as a specific pattern. If the sequentially received data string includes an error, it is preferred that the error can be detected. Furthermore, it is preferred that the data string generated by the pattern generator 7 be a string having ensured DC balance and run length. A most preferred specific pattern is a PRBS (pseudo random bit sequence) pattern generated according to a higher order polynomial.

The multiplexer 9 temporally multiplexes the serial bit strings received from the n block framers 5 and the pattern generator 7 on a bit-by-bit basis. Thus, the multiplexer 9 outputs, as multiplexed data, a serial bit string that is (n+1) times faster than the serial bit string on the input side. Two clocks used for temporally multiplexing are a low frequency clock supplied from the PLL 17 and a high frequency clock that is correctly (n+1) times faster than the low frequency clock. The low frequency clock is for reading data. The high frequency clock is for transmitting data.

[Configuration of Receiver Apparatus]

FIG. 5 shows a functional block configuration of a receiver apparatus according to this embodiment.

A receiver apparatus 105 includes a single input channel (RxP1), a clock source 21, a PLL 22, a CDR 23, a clock divider 25, a de-multiplexer 27, a pattern synchronizer 29, n block de-framers 31, n FIFOs 33, a clock source 35, n PLLs 37, n frequency controllers 39, and n output channels (RxP1, . . . , RxPn).

[Operation of Receiver Apparatus]

(a) Overview

An overview of data processing executed by the receiver apparatus 105 will be described. The receiver 105 receives a serial data signal from the input channel RxH1. This data signal is input into the CDR 23. A data string recovered by the CDR 23 is converted by the de-multiplexer 27 from a serial form into a parallel form. The de-multiplexer 27 converts the single piece of serial data into n+1 pieces of serial data. The n pieces of serial data thereamong that do not include a fixed pattern are transmitted to the n block de-framers 31. The single piece of serial data including the fixed pattern is transmitted to the pattern synchronizer 29.

The block de-framer 31 captures only valid bit data configuring a valid block from the input data string, and stores the data in the FIFO memory of the FIFO 33. That is, the data in the invalid block and the header data are excluded by the block de-framer 31. The FIFO 33 sequentially reads the stored data according to the clock signal received from the PLL 37. The read data initially has a data rate identical to that of the data signal channel (TxP1, . . . , TxPn) of the transmitter apparatus 100. Data corresponding to the respective input channels (TxP1, . . . , TxPn) of the transmitter apparatus 100 are output from the respective output channels (RxP1, . . . , RxPn) of receiver apparatus 105 that have the same channel numbers.

(b) Detail

Hereinafter, processing operations executed in components configuring the receiver apparatus 105 will sequentially be described in detail.

The CDR 23 extracts a clock component from the input serial data signal. The CDR 23 operates on the basis of the high frequency clock supplied from the PLL 22, and recovers a recovered clock synchronized with serial data signal and bit data synchronized with this clock. The recovered bit data is supplied to the divider 25. The recovered clock is supplied to the divider 25 and the de-multiplexer 27.

The clock source 21 is a circuit that generates a clock having a natural frequency. This frequency is required to be approximately identical to a frequency that is obtained by dividing the data rate of the serial data signal output from the transmitter 100 by a constant.

The PLL 22 is a circuit generating a clock having a frequency exactly constant times the frequency of the reference clock received from the clock source 21.

The clock divider 25 is a circuit generating a divided clock that is obtained by precisely dividing the recovered clock supplied from the CDR 23 by a factor n+1. This divided clock is distributed to the de-multiplexer 27, all the block de-framers 31, all the FIFOs 33, and the pattern synchronizer 29.

The de-multiplexer 27 receives the high frequency recovered clock from the CDR 23 while receiving the low frequency divided clock from the clock divider 25. The de-multiplexer 27 converts the bit data received from the CDR 23 in the serial form into that in a parallel form according to the recovered clock. In this conversion, the position at which the bit data is captured in units of n+1 bits according to the received order can be changed as with a general barrel shifter circuit. The capturing position is according to designation by the pattern synchronizer 29.

The pattern synchronizer 29 receives bit data strings captured by the de-multiplexer 27 at intervals of n+1 bits. The pattern synchronizer 29 verifies the correlation between the received bit data string and the specific pattern generated by the pattern generator 7 of the transmitter 100 (FIG. 3). If the correlation between the bit data string being currently received and the specific pattern is significantly low, the pattern synchronizer 29 issues an instruction of shifting the capturing position in the de-multiplexer 27 by one bit and verifies the correlation again. If the correlation between the bit data strings can be verified for at least a prescribed time, the pattern synchronizer 29 fixes the capturing position of bit data that is to be used in the de-multiplexer 27.

Each block de-framer 31 receives temporally consecutive serial bit string data from the de-multiplexer 27. Each block de-framer 31 identifies the header identifiers "10" and "01" defined by the block format from the serial bit string data, and determines the identified position as a boundary of the block format. This allows the block framer 5 of the transmitter 100 (FIG. 1) to extract only valid data from the payload. Subsequently, the block de-framer 31 transmits only the valid data to the FIFO 33.

The FIFO 33 stores the valid data received from the block de-framer 31 in the internal FIFO memory. Meanwhile, the FIFO 33 sequentially reads the stored data according to the clock supplied from the PLL 37. At this time, if the rate of writing the valid data is equal to the rate of reading the stored data, the amount of stored data is averaged to zero. Accordingly, the FIFO 33 normally operates. If the rate of writing is higher than the rate of reading, the FIFO memory runs out of space, causing an overflow occurs. If the rate of writing is lower than the rate of reading, data shortage occurs, causing an underflow. The FIFO 33 notifies the frequency controller 39 of the OF or UF status and the current remaining amount of stored data.

The clock source 35 is a circuit that generates a reference clock having a natural frequency. This frequency preferably has a rate that is obtained by dividing the high frequency clock generated by the PLL 37 by a constant.

The PLL 37 is a circuit that generates a high frequency clock having a frequency that is obtained by multiplying the reference clock received from the clock source 35 by the number of divisions notified from the frequency controller 39.

The frequency controller 39 monitors the state of the FIFO memory of the FIFO 33 (OF, UF, the remaining amount of stored data), and controls the frequency of the clock generated by the PLL 37 such that the FIFO 33 normally operates. At this time, the frequency controller 39 designates a division ratio for controlling the frequency of the high frequency clock generated by the PLL 37, by means of a real number.

Figure 6:
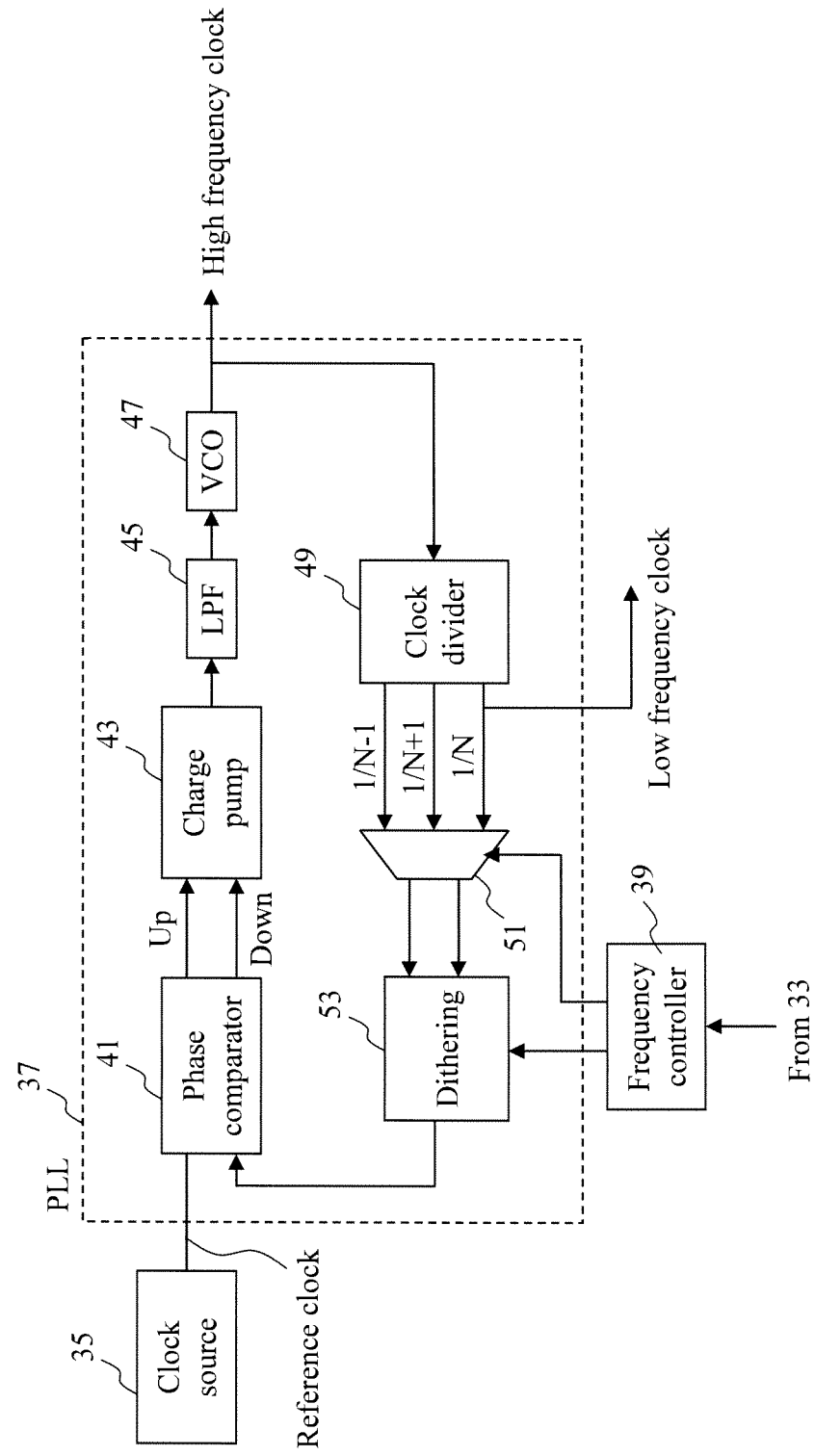
FIG. 6 is a diagram showing an example of a configuration of a PLL (phase locked loop) circuit used in Embodiment 1.

FIG. 6 shows a functional block configuration of the PLL 37 used in the receiver apparatus according to this embodiment. The PLL 37 includes a phase comparator 41, a charge pump 43, a LPF 45, a VCO 47, a clock divider 49, a selector 51 and a ditherer 53.

The high frequency clock of the PLL 37 is generated by a VCO (voltage controlled oscillator) circuit of the VCO 47. As generally known, the VCO circuit is capable of changing the frequency of the clock to be generated, according to the magnitude of the supplied voltage. The high frequency clock generated by the VCO 47 is supplied not only to the FIFO 33 but also to the clock divider 49.

The clock divider 49 is a circuit for dividing an input high frequency clock. Through the dividing, this divider generates three divided clocks having different division ratios. In this embodiment, the three division ratios are N, N−1 and N+1. Note that N is a natural number at least two. The division ratio may be three ratios, or N, N−M and N+M. Note that N is a natural number where N>M.

The selector 51 is a circuit that selects any two from among input three divided clocks and outputs the selected clocks.

The ditherer 53 is a circuit that mixes the input two divided clocks such that a clock to be output has a division ratio designated by the real number by the frequency controller 39. Typically, a sigma-delta modulator circuit is adopted.

The phase comparator 41 is a circuit that compares the phase and frequency of the clock supplied from the ditherer 53 with those of the reference clock generated by the clock source 35 and generates an instruction of advancing the phase (up) or an instruction of delaying the phase (down).

The charge pump 43 is a circuit that converts a digital signal that is supplied from the phase comparator 41 and indicates the instruction of advancing the phase (up) or the instruction of delaying the phase (down), into an analog signal with a voltage value (or a current value). This conversion can typically be realized by a charge pump circuit. However, there is another method of realization. Accordingly, this embodiment does not specify the method of realization.

The LPF 45 is a LPF (low pass filter) circuit that allows only a low frequency component of the analog signal of the voltage value (or current value) generated by the charge pump 43 to pass. The LPF circuit is generally widely known. Accordingly, this embodiment does not specify the detailed configuration. The LPF 45 generates a voltage for controlling the frequency of the clock generated by the VCO 47.

Figure 7:
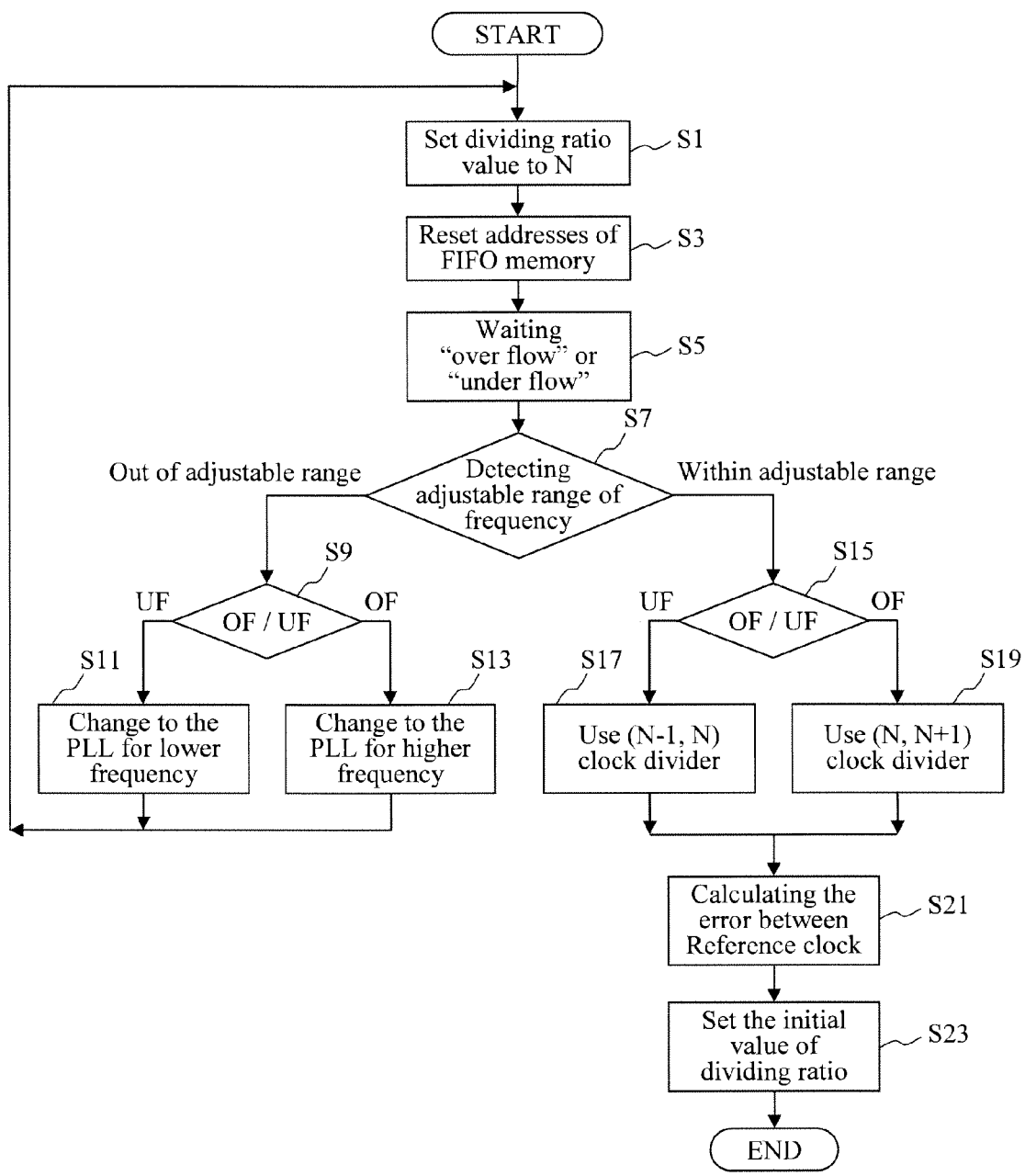
FIG. 7 is a diagram illustrating an initial sequence of PLL control in a frequency controller according to Embodiment 1.

FIG. 7 shows an initial control sequence of the PLL 37 according to the frequency controller 39.

In step S1, the frequency controller 39 sets the division ratio of the PLL 37 to N. In this embodiment, N corresponds to an intermediate value among controllable values.

In step S3, the frequency controller 39 resets the remaining amount of stored data in the FIFO 33, and stops reading the stored data until the remaining amount A of stored data becomes half the amount of data that can be stored in the FIFO 33. After the remaining amount of stored data reaches the data amount A, the frequency controller 39 restarts reading the stored data.

In step S5, the frequency controller 39 monitors the notification of the OF status or the UF status, and measures a time T from the start of step S5 and to the notification.

In step S7, the frequency controller 39 determines whether the relationship between the measured time T and the data amount A falls in an adjustable range of frequency (preliminarily designated by a specification of the VCO 47 (FIG. 6)) by the PLL 37 or not. If the frequency controller 39 determines that the relationship is out of the range, this controller transitions to step S9. If the frequency controller 39 determines that the relationship is within the range, this controller transitions to step S15. According to the relationship between the time T and the data amount A here, the time average data rate of the corresponding data flow can be acquired. According to the data amount, the transmission data rate of the corresponding data flow can be estimated.

In step S9, the frequency controller 39 determines whether the status of the FIFO 33 is the OF status or the UF status. In the case of the UF status, the frequency controller 39 transitions to step S11. In the case of the OF status, the frequency controller 39 transitions to step S13.

In step S11, the frequency controller 39 changes the mode of the PLL 37 to a mode for operation at a low speed data rate. Subsequently, the frequency controller 39 transitions to step S1.

In step S13, the frequency controller 39 changes the mode of the PLL 37 to a mode for operation at a high speed data rate. Subsequently, the frequency controller 39 transitions to step S1.

In step S15, the frequency controller 39 determines whether the status of the FIFO 33 is the OF status or the UF status. In the case of the UF status, the frequency controller 39 transitions to step S17. In the case of the OF status, the frequency controller 39 transitions to step S19.

In step S17, the frequency controller 39 instructs the selector 51 of the PLL 37 to select two ratios, or the division ratio N−1 and the division ratio N. Subsequently, the frequency controller 39 transitions to step S21.

In step S19, the frequency controller 39 instructs the selector 51 of the PLL 37 to select two ratios, or the division ratio N and the division ratio N+1. Subsequently, the frequency controller 39 transitions to step S21.

In step S21, the frequency controller 39 acquires the difference between the high frequency clock according to the division ratio N and the rate of data being currently received, on the basis of the time T measured in step S5 and the storable data amount A. Subsequently, the frequency controller 39 transitions to step S23.

In step S23, the frequency controller 39 acquires the division ratio of the rate of the data being currently received on the basis of the acquired clock difference, and sets the ditherer 53 of the PLL 33 to this ratio. Subsequently, the frequency controller 39 transitions to step S1.

Figure 8:
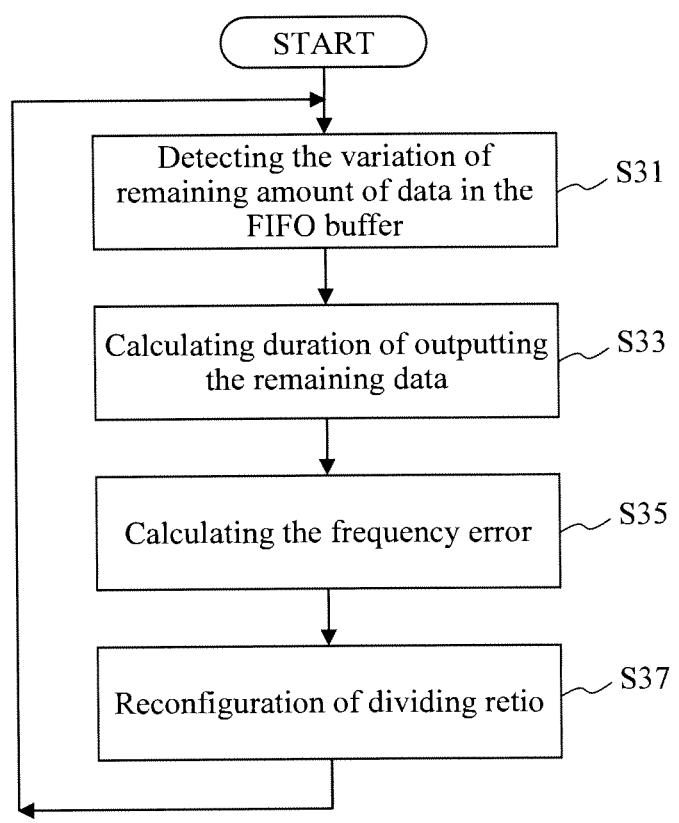
FIG. 8 is a diagram illustrating an update sequence of the PLL control in the frequency controller according to Embodiment 1.

FIG. 8 shows a control sequence of updating the PLL 37 by the frequency controller 39. This operation is executed after completion of the initial control sequence.

In step S31, the frequency controller 39 successively monitors the remaining amount of stored data of the FIFO 33, and acquires the difference of remaining amounts of data at the last monitoring time and the current monitoring time. Subsequently, the frequency controller 39 transitions to step S33.

In step S33, the frequency controller 39 acquires an elapsed duration (the number of cycles) corresponding to the acquired difference. Subsequently, the frequency controller 39 transitions to step S35.

In step S35, the frequency controller 39 acquires the difference of clocks between the high frequency clock being currently generated by the PLL 37 and the data rate of the data string being currently received, on the basis of the difference acquired in step S31 and the elapsed duration acquired in step S33. Subsequently, the frequency controller 39 transitions to step S37.

In step S37, the frequency controller 39 acquires a division ratio suitable for the data rate of the data string being currently received on the basis of the clock difference acquired in step S35, and updates the setting of the ditherer 53 configuring the PLL 37. Subsequently, the frequency controller 39 transitions to step S31.

[Advantageous Effects of Embodiment]

Execution of the sequence allows the frequency controller 39 to cause the frequencies of the clocks generated by the PLLs 37 corresponding to the respective data flows to match with the data rates of the input channels on the side of the transmitter apparatus. That is, even in the case where digital signals having frequency information different from each other are input into the respective input channels, the matching between the input channel and the output channel can be ensured. Furthermore, the transmitter apparatus 100 and receiver apparatus 105 according to this embodiment are not affected by the content of data or a protocol. This allows the apparatus configuration to be downsized.

C. Embodiment 2

A data multiplexer system according to Embodiment 2 will hereinafter be described. A system according to this embodiment has characteristics capable of multiplexing data more efficiently than the system according to Embodiment 1. This embodiment corresponds to an expanded example of the system according to Embodiment 1. Accordingly, only differences therefrom will be described in the following description.

[Configuration of Transmitter Apparatus]

Figure 9:
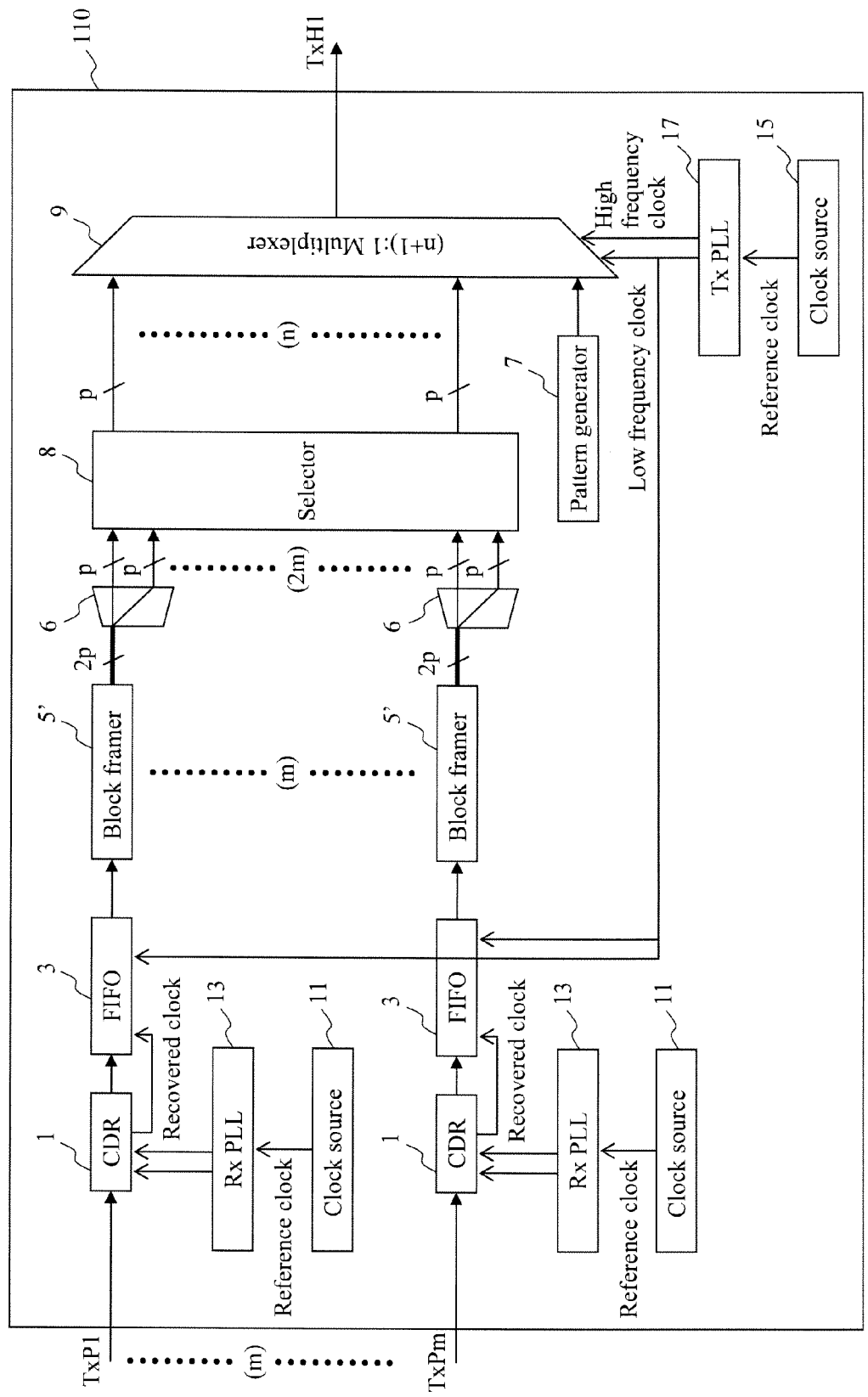
FIG. 9 is a diagram showing an example of a configuration of a multiplexer circuit (transmitter apparatus) according to Embodiment 2.

FIG. 9 shows a functional block configuration of a transmitter apparatus 110 according to this embodiment. The transmitter apparatus 110 includes m input channels (TxP1, . . . , TxPm), m CDRs 1, m FIFOs 3, m block framers 5', m de-multiplexers 6, a pattern generator 7, a selector 8, a multiplexer 9, a clock source 11, a PLL 13, a clock source 15, a PLL 17, and a single output channel (TxH1).

[Operation of Transmitter Apparatus]

(a) Overview

First, an overview of data processing executed in the transmitter apparatus 110 will be described. The transmitter apparatus 110 receives data signals from m input channels (TxP1, . . . , TxPm). These data signals may have data rates from different clock sources, or a data rate completely synchronized with one clock. The m input channels (TxP1, . . . , TxPm) are input into the CDRs 1 corresponding to the respective channels. Processes thereafter are executed independently on the m data signals.

The data signal output from the CDR 1 is sequentially processed by the FIFO 3 and the block framer 5' in this order. The data independently processed by up to the m block framers 5' are input into the m de-multiplexers 6 at respective independent timings. That is, each of the m de-multiplexers 6 divides the input data signal into two data signals. Accordingly, 2m data signals are input into the selector 8.

The selector 8 selects any n data signals from among the 2m data signals, and transmits the selected signals to the multiplexer 9. The multiplexer 9 temporally multiplexes the n data signals and a synchronization pattern generated by the pattern generator 7 on a bit-by-bit basis, and outputs the multiplexed data to the high speed output channel (TxH1).

(b) Detail

Hereinafter, only parts different from those of Embodiment 1 (added or modified parts) among processing operations executed in the components configuring the transmitter apparatus 110 will be described. Accordingly, description on parts of the same processing operation and function is omitted.

The block framer 5' sequentially reads data stored in the FIFO 3, and then divides the data into blocks having a prescribed size and stores the blocks in the internal memory. Subsequently, the block framer 5' reads the block having the prescribed size from the internal memory, and transmits the block to the de-multiplexer 6.

Figure 10:
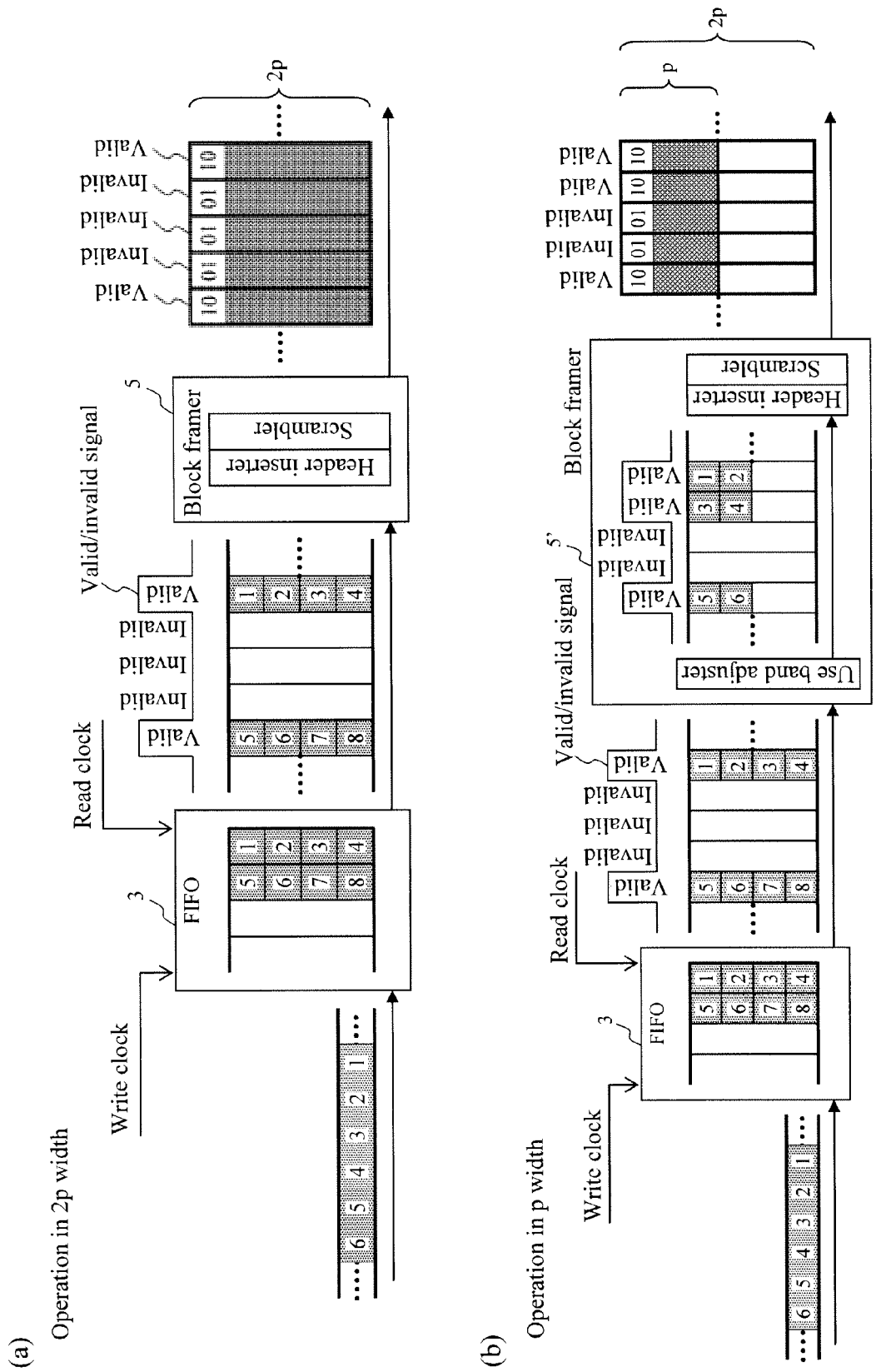
FIG. 10 is a diagram illustrating a block forming process executed in a block framer.

FIG. 10 shows the difference of block framing methods executed in the block framer 5 (FIG. 3) and the block framer 5'

First, FIG. 10 (a) will be described. FIG. 10 (a) shows a processing method in the block framer 5 corresponding to that of Embodiment 1. As described above, the input bandwidth of the FIFO 3 can be changed according to the clock frequency recovered by the CDR 1, while the output is read in a prescribed bandwidth.

Accordingly, in the case where the input bandwidth of the FIFO 3 is narrower than the output bandwidth, the FIFO memory becomes in the "FIFO empty state" and the data signal cannot be read from the FIFO memory until a prescribed amount of data is accumulated in the FIFO memory. Thus, the FIFO 3 outputs invalid data during the time period in the "FIFO empty state". That is, in the case where the difference between the input and output bands, the ratio of invalid data in the output band increases, thereby reducing use efficiency.

Next, FIG. 10 (b) will be described. FIG. 10 (b) shows a processing method in block framer 5' that corresponds to that of Embodiment 2. As described in the drawing, the block framer 5' can select any of the output bands p and 2p (bps). In this embodiment, the output band is selected from the two, or p and 2p. Increase in selection alternatives allows the use efficiency of the band to be improved. The block framer 5' measures a band occupied by valid data, on the data string that includes valid data and invalid data and is input from the FIFO 3. If the band of the input valid data is equal to or less than p, the data string is smoothed such that the output band is p, thereby improving the use efficiency of the band.

The de-multiplexer 6 includes one input and two outputs, and has a function of separating the input having a band 2p into two outputs each having a band p. As described above, this separating function stems from the capability of the block framer 5' that selects and outputs one of the output with the bandwidth p and the output with the bandwidth 2p. Accordingly, in the case of increasing the types of selectable bandwidths, the separating number is increased according to the selectable bandwidths The selector 8 includes 2m inputs to which the m de-multiplexers 6 are connected, and n outputs connected to the multiplexer 9. One input arbitrarily selected from among the 2m inputs is output from each output.

According to the configuration, in the case where the input band to the block framer 5' is narrow, the output band of the block framer 5' is restricted to p and only the output of the de-multiplexer 6 corresponding to the band p (any one output, in this embodiment) is used. The selector 8 selects only the output used by the de-multiplexer 6, thereby allowing the multiplexing efficiency of data in the multiplexer 9 to be improved.

[Configuration of Receiver Apparatus]

Figure 11:
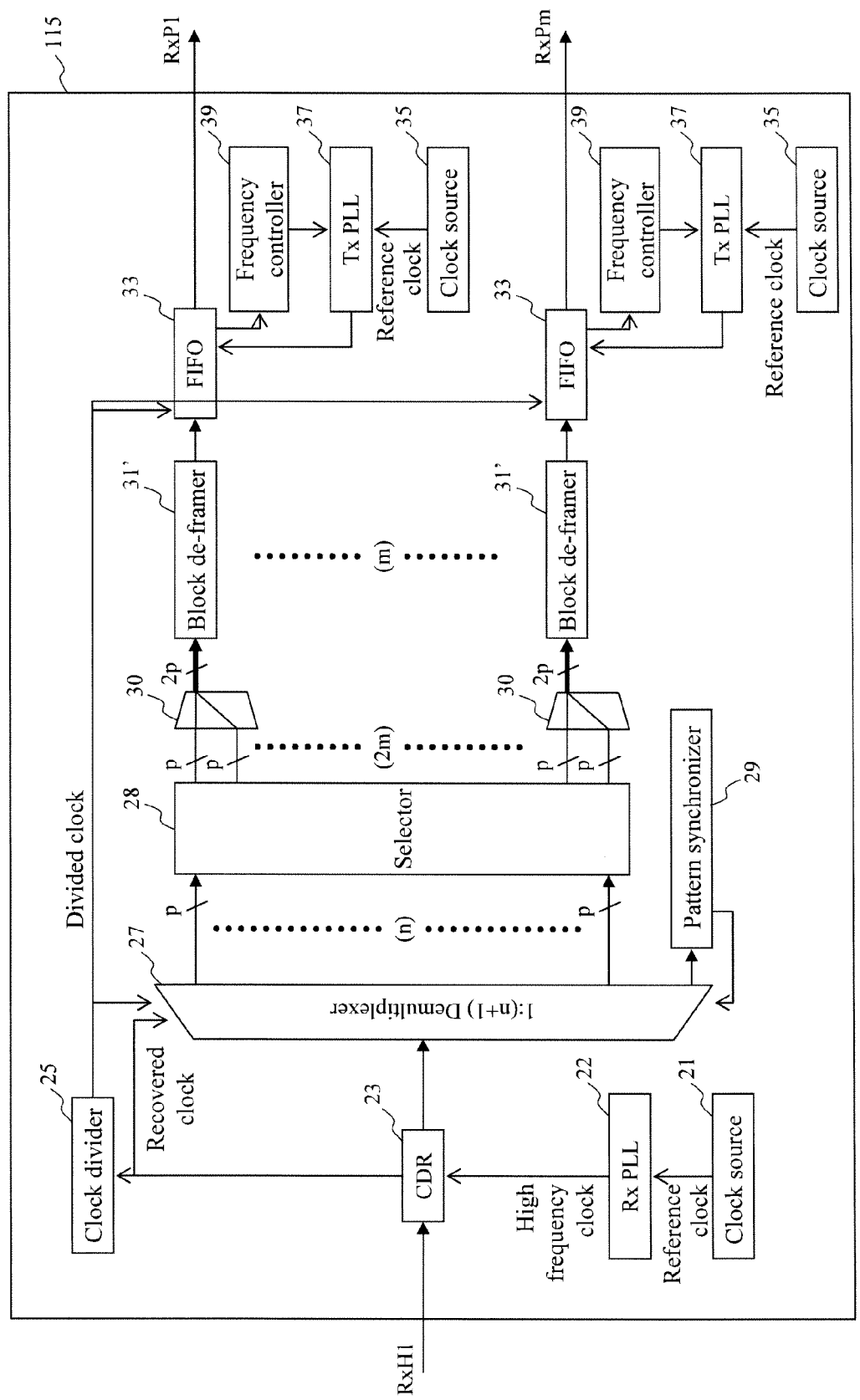
FIG. 11 is a diagram showing an example of a configuration of a de-multiplexer circuit (receiver apparatus) according to Embodiment 2.

FIG. 11 shows a functional block configuration of a receiver apparatus according to this embodiment.

The receiver apparatus 115 includes a single input channel (RxH1), a clock source 21, a PLL 22, a CDR 23, a clock divider 25, a de-multiplexer 27, a selector 28, a pattern synchronizer 29, m multiplexers 30, m block de-framers 31', m FIFOs 33, a clock source 35, m PLLs 37, m frequency controllers 39, and m output channels (RxP1, . . . , RxPm).

[Operation of Receiver Apparatus]

(a) Overview

An overview of data processing executed by the receiver apparatus 115 will be described. The receiver 115 receives a serial data signal from an input channel RxH1. The data signal is input into the CDR 23. A data string recovered by the CDR 23 is converted by the de-multiplexer 27 from a serial form to a parallel form. The de-multiplexer 27 converts a single piece of serial data into n+1 pieces of serial data. The n pieces of serial data thereamong that do not include the fixed pattern are transmitted to the selector 28. The one piece of serial data that includes the fixed pattern is transmitted to the pattern synchronizer 29.

The selector 28 selects any n inputs with respect to 2m outputs, and outputs the selected inputs to the m multiplexers 30. Each multiplexer 30 bundles the two input with a bandwidth p, and transmits outputs with a bandwidth 2p to the corresponding block de-framer 31'. Each block de-framer 31' extracts only valid data in the valid block included in the input, and stores the data in the FIFO memory in the FIFO 33.

Each FIFO 33 sequentially reads the stored data from the FIFO memory according to the clock signal received from the corresponding PLL 37, and outputs the data. The read data is output from the output channel (RxP1, . . . , RxPm) of the receiver apparatus 115 which has a data rate identical to that of the input channel (TxP1, . . . , TxPm) of the transmitter apparatus 110 and to which a number identical to that of the corresponding input channel is assigned.

(b) Detail

Hereinafter, only parts different from those of Embodiment 1 (added or modified parts) among processing operations executed in the components configuring the receiver apparatus 115 will be described. Accordingly, description on parts of the same processing operation and function are omitted.

The selector 28 includes n inputs (each having a bandwidth p) connected from the de-multiplexer 27, and 2m outputs (each having a bandwidth p) connected to the m multiplexers 30. The selector 28 is capable of outputting one piece of data arbitrarily selected from among the n inputs to each output. However, in the case where the input of the multiplexer 30 subsequent to the selector 28 only uses a bandwidth p, the selector 28 outputs invalid data to an input terminal that the multiplexer 30 does not use.

The multiplexer 30 includes two inputs each having a bandwidth of p, and one output having a bandwidth of 2p. The two inputs are connected to two of the 2m outputs of the selector 28. The multiplexer 30 multiplexes the two inputs and outputs the multiplexed data.

Each block de-framer 31' receives temporally consecutive serial bit string data from the multiplexer 30. Each block de-framer 31' identifies the header identifiers "10" and "01" defined by the block format from the serial bit string data, and determines that the identified position as a boundary of the block format. This allows only valid data to be extracted from the payload block-framed by the block framer 5' of the transmitter 110. At this time, in the case where the bandwidth in use is p, the block de-framer 31' converts the bandwidth of the extracted valid data into 2p, and transmits data to the FIFO 33.

[Advantageous Effects of Embodiment]

As described above, according to use of the transmitter apparatus 110 of this embodiment, on an input whose bandwidth in actual use is less than p among the input m data signal channels (TxP1, . . . , TxPm), the data string is preliminarily smoothed such that the output bandwidth is p, which allows the bandwidth in use for multiplexing to be reduced. This enables the data multiplexing efficiency to be improved.

Furthermore, use of the receiver apparatus 115 according to this embodiment allows the same data rates as those on the data signal channels (TxP1, . . . , TxPm) on the transmission side to be reproduced on the data signal channels (RxP1, . . . , RxPn) of the respective corresponding outputs.

D. Embodiment 3

The above Embodiments 1 and 2 multiplex the channels into the single channel. This embodiment is different in that a plurality of channels can be multiplexed into a plurality of channels. This embodiment corresponds to an expanded example of the system according to Embodiment 1. Accordingly, only differences therefrom will be described in the following description.

[Configuration of Transmitter Apparatus]

Figure 12:
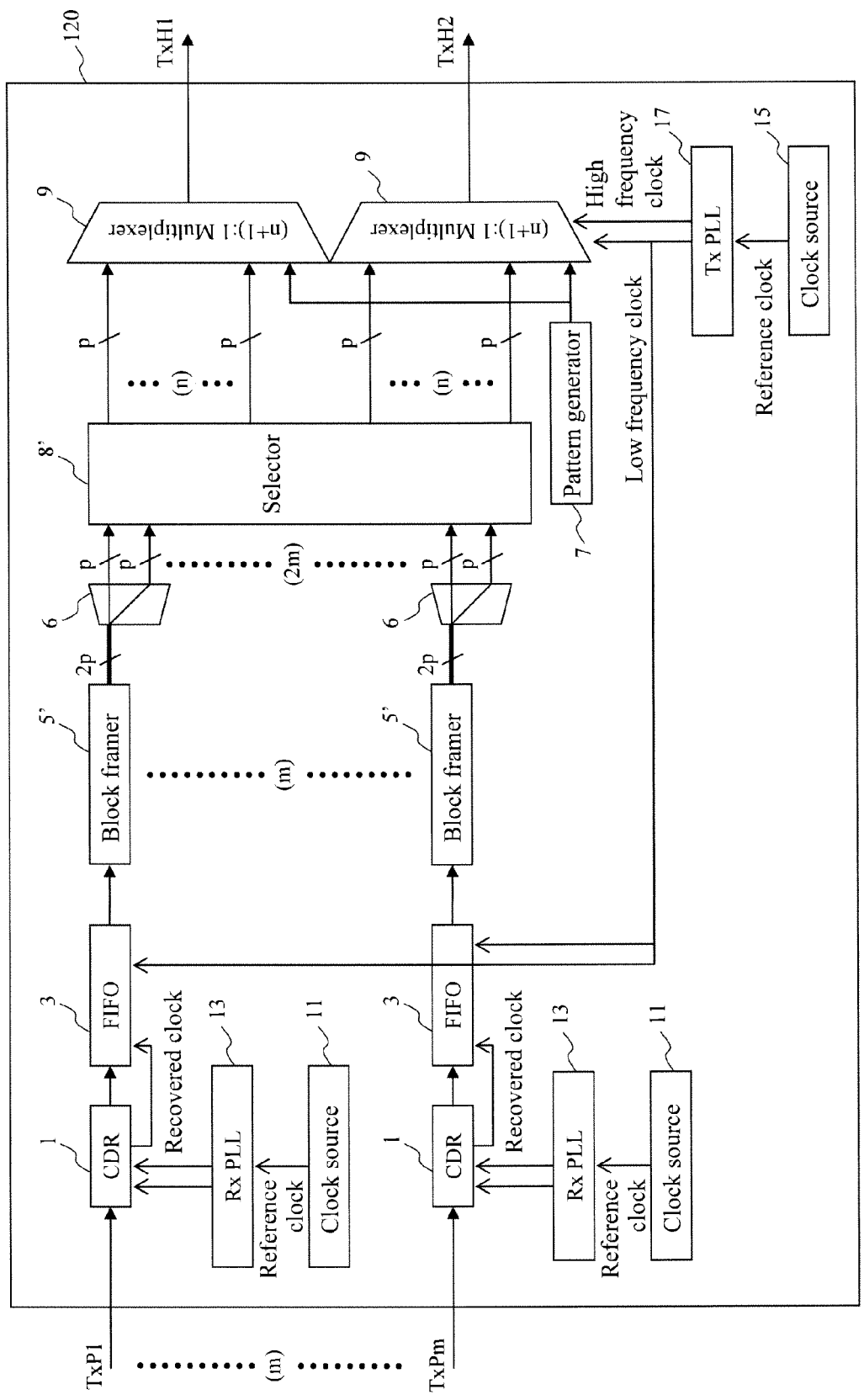
FIG. 12 is a diagram showing an example of a configuration of a multiplexer circuit (transmitter apparatus) according to Embodiment 3.

FIG. 12 shows a functional block configuration of a transmitter apparatus 120 according to this embodiment.

The transmitter apparatus 120 includes m input channels (TxP1, . . . , TxPm), m CDRs 1, m FIFOs 3, m block framers 5', m de-multiplexers 6, a pattern generator 7, a selector 8', q (n+1:1) multiplexers 9, a clock source 11, a PLL 13, a clock source 15, a PLL 17, and q output channels (TxH1, . . . , TxHq).

In this description and FIG. 12, the description will be made assuming that q=2 for the sake of simplicity. Furthermore, in this description and FIG. 12, as with Embodiment 2, only the case where the de-multiplexer 6 separates data in a ratio 1:2 will be described. However, the ratio is not limited thereto.

[Operation of Transmitter Apparatus]

(a) Overview

First, an overview of data processing executed in the transmitter apparatus 120 will be described.

The transmitter apparatus 120 receives serial data signals from m input channels (TxP1, . . . , TxPm). These data signals may have data rates from different clock sources, or a data rate completely synchronized with one clock. The serial data signals are input into the CDRs 1 corresponding to the respective channels. The following processes are performed independently on the m data signals.

The data signal output from the CDR 1 is sequentially processed by the FIFO 3 and the block framer 5' in this order. The data signal independently processed by up to the m block framers 5' is input into the m de-multiplexers 6 at respective independent timings. Each de-multiplexer 6 divides one input into two outputs and transmits the output to the selector 8'.

The selector 8' selects any (2×n) from among 2m input signals input from the m de-multiplexer 6, and transmits n signals of the selected signals to each of the two multiplexers 9. Each multiplexer 9 temporally multiplexes the n data signals supplied from the selector 8' and the synchronization pattern generated by the pattern generator 7 on a bit-by-bit basis, and outputs the multiplexed data from the high speed output channel (TxH1, . . . , TxH2).

(b) Detail

Hereinafter, only parts (added or modified parts) of processing operations executed by components configuring the transmitter apparatus 120 that are different from those of Embodiments 1 and 2 will be described. Accordingly, description on parts of the same processing operation and function is omitted.

The selector 8' includes 2m inputs to which the m de-multiplexers 6 are connected, and (2×n) outputs connected to the two multiplexers 9. One piece of data arbitrarily selected from among the 2m inputs is output from each output.

The above configuration allows the data acquired by multiplexing the data input from the input channels (TxP1, . . . , TxPm) to be output to the output channels (TxH1, . . . , TxHq) in a distributed manner. This allows transmission with a capacity larger than that of transmitter apparatus used in Embodiment 1 or 2.

[Configuration of Receiver Apparatus]

Figure 13:
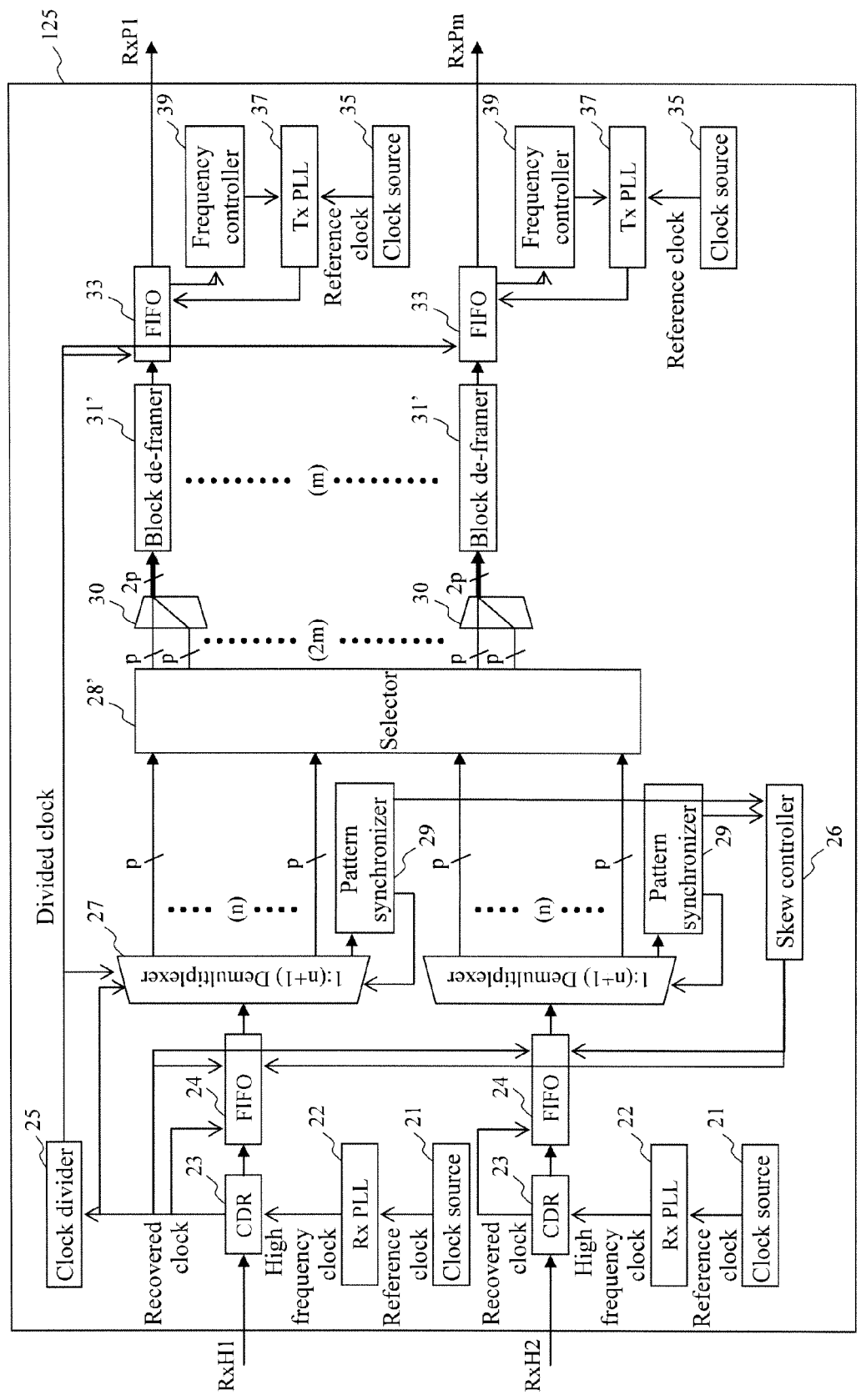
FIG. 13 is a diagram showing an example of a configuration of a de-multiplexer circuit (receiver apparatus) according to Embodiment 3.

FIG. 13 shows a functional block configuration of a receiver apparatus according to this embodiment. The receiver apparatus 125 includes q input channels (RxH1, . . . , RxHq), a clock source 21, a PLL 22, q CDRs 23, a clock divider 25, q deskewing FIFOs 24, a skew controller 26, q de-multiplexers 27, a selector 28', q pattern synchronizers 29, m multiplexers 30, m block de-framers 31', m FIFOs 33, a clock source 35, m PLLs 37, m frequency controllers 39, and m output channels (RxP1, . . . , RxPm).

In this description and FIG. 13, the description will also be made assuming that q=2 for the sake of simplicity. Furthermore, in this description and FIG. 13, as with Embodiment 2, only the case where the multiplexer 30 combines data in a ratio 2:1 will be described. However, the ratio is not limited thereto.

[Operation of Receiver Apparatus]

(a) Overview

First, an overview of data processing executed in the receiver apparatus 125 will be described. The receiver 125 receives serial data signals from two input channels (RxH1 and RxH2). The data signals are input into the respective corresponding two CDRs 23. The data strings recovered by the CDRs 23 are stored in the respective corresponding deskewing FIFOs 24.

The deskewing FIFOs 24 simultaneously read the stored data strings according to reading control by the skew controller 26 and output the respective corresponding de-multiplexers 27. The de-multiplexer 27 converts the received data string from a serial form to a parallel form, and transmits the data to corresponding selector 28' and the pattern synchronizer 29.

The selector 28' outputs one input arbitrarily selected from among (2×n) inputs to each of the 2m outputs. Each of the m multiplexers 30 is supplied with two pieces of data among the 2m outputs of the selector 28'. Each multiplexer 30 multiplexes the two inputs output from the selector 28' and outputs the multiplexed data to the corresponding block de-framer 31'.

Each block de-framer 31 extracts only valid data in the valid block included in each input, and stores the data in the FIFO memory in the FIFO 33.

Each FIFO 33 sequentially reads the stored data from the FIFO memory according to the clock signal received from the corresponding PLL 37, and outputs the data. The read data is output from the output channels (RxP1, . . . , RxPm) of the receiver apparatus 125 which have data rates identical to those of the respective input channels (TxP1, . . . , TxPm) of the transmitter apparatus 120 and to which numbers identical to those of the respective input channels are assigned.

(b) Detail

Hereinafter, only parts (added or modified parts) of processing operations executed by components configuring the receiver apparatus 125 that are different from those of Embodiments 1 and 2 will be described. Accordingly, description on parts of the same processing operation and function is omitted.

The deskewing FIFOs 24 store the received data on the basis of the recovered clocks supplied from the respective corresponding CDRs 23. Note that the received data is read in synchronization with any one of the recovered clocks. The reading start position can be changed according to an instruction issued by the skew controller 26.

The skew controller 26 monitors the synchronization operations of the two pattern synchronizers 29 and acquires skews in the received data in the temporal axis on the respective input channels. A method preferable to use for acquiring the skew will hereinafter be described.

The two pattern synchronizers 29 receive a common cyclic synchronization pattern. Accordingly, when the difference of phases of synchronization patterns received on the inputs is detected, the difference of phases is equal to the skew. The skew controller 26 always monitors the position of reading the deskewing FIFO 24 such that the acquired skew becomes zero. Accordingly, on the data strings input into the two de-multiplexers 27, the temporal relationship at the time of being initially output from the transmitter apparatus 120 is reproduced.

The selector 28' includes (2×n) inputs (each having a bandwidth p) connected from two de-multiplexers 27, and 2m outputs (each having a bandwidth p) connected to the m multiplexers 30. The selector 28' can transmits selected data of any one among the (2×n) inputs to each output. However, in the case where the input of the multiplexer 30 at a stage subsequent to the selector 28' only uses a bandwidth p, the selector 28' outputs invalid data for the input of the multiplexer 30 that is not used.

In general, among pieces of data transferred on the output channels (TxH1, ..., TxHq) of the transmitter apparatus 120 in a distributed manner, simultaneous arrival on the side of the receiver apparatus 125 is not ensured. However, in the case of this embodiment, the data strings are input into the respective input channels (RxH1, ..., RxHq) of the receiver apparatus 125 and subsequently the skew controller 26 and the deskewing FIFOs 24 adjust the temporal relationship to that at the time of transmission. Accordingly, large capacity transmission in comparison with the cases of Embodiments 1 and 2, and data recovery on the receiving side can be realized.

E. Another Embodiment

A part or the entire parts of the configurations, functions, processors, processing means and the like may be realized as, for instance, integrated circuits and other hardware. The configurations, functions and the like may be realized by a processor analyzing and executing programs that realize respective functions. That is, the configurations and the functions may be realized as software. Information of programs, tables, files and the like that realize the functions can be stored in storing devices, such as a memory, a hard disk and a SSD (solid state drive), and storing media, such as an IC card, an SD card and a DVD.

Only control lines and information lines that are required for the sake of description are indicated. All control lines and information lines that are required for a product are not completely shown. In actuality, it can be considered that all the configurational components are connected to each other.

The apparatus, the transmitter apparatus and the receiver apparatus according to the present invention are not limited to application of electric transmission and optical transmission in the apparatus. These apparatuses can be used for mutual connection between apparatuses over a long distance, that is, a general long range transmission.

DESCRIPTION OF SYMBOLS

100 transmitter apparatus
105 receiver apparatus
110 transmitter apparatus
115 receiver apparatus
120 transmitter apparatus
125 receiver apparatus

What is claimed is:

1. A data multiplexer system comprising: a transmitter apparatus configured to transmit transmission data to a transmission path; and a receiver apparatus configured to receive the transmission data from the transmission path,
   wherein the transmitter apparatus comprises:
      a plurality of input channels, each of which is configured to receive transmission data having frequency information different from frequency information of the other input channels;
      a plurality of block framers configured to divide transmission data corresponding to the respective input channels into data blocks having a fixed length, as valid data; and
      a multiplexer configured to multiplex the data blocks corresponding to the respective input channels and output multiplexed data to the transmission path, and
   the receiver apparatus comprises:
      a de-multiplexer configured to divide a data string received via the transmission path into as many data flows as the input channels on a side of the transmitter apparatus;
      a plurality of FIFOs configured to execute a process of restoring valid data from the corresponding data flows and storing the data in respective FIFO memories, and a process of reading the transmission data from the respective FIFO memories and outputting the data to the corresponding output channels; and
      a plurality of frequency controllers configured to execute a process of estimating transmission data rates from time average data rates of the respective corresponding data flow, and a process of adjusting the frequencies of clocks supplied to the corresponding FIFOs so as to be equal to the respective estimated transmission data rates.

2. The data multiplexer system according to claim 1,
   wherein the frequency controller is configured to acquire a difference between the frequency of the clock and the frequency of the transmission data rate on the basis of a unit time difference in data amount of the transmission data stored in the FIFO memory separately provided for the data flow, and to adjust the frequency of the clock such that the difference is zero.

3. The data multiplexer system according to claim 1,
   wherein a PLL circuit generating the clock comprises an N clock divider, an N−M clock divider, and an N+M clock divider configured to generate an N divided clock, an N−M divided clock, and an N+M divided clock, respectively, that are defined according to natural numbers N and M (where N>M), and
   the frequency controller is configured to adjust the frequency of the clock generated by the PLL circuit, by controlling spreading between a central clock in a frequency range defined by the N clock divider, an upper limit clock in the frequency range defined by the N−M clock divider, and a lower limit clock in the frequency range defined by the N+M clock divider.

4. The data multiplexer system according to claim 1,
   wherein the block framer has a function of smoothing a ratio of valid data included in the data blocks corresponding to the data flow, and
   the de-multiplexer has a function of reconstructing the data blocks by multiplexing the data strings corresponding to the same data flow.

5. The data multiplexer system according to claim 4,
   wherein the transmitter apparatus comprises a plurality of the multiplexers corresponding to the respective transmission paths, and a selector configured to assign the data blocks corresponding to the respective input channels to the multiplexers in a distributed manner, and the receiver apparatus comprises a plurality of second FIFO memories corresponding to the respective transmission paths, and a plurality of the de-multiplexers corresponding to the respective second FIFO memories, and the second FIFO memories are configured to read data strings using a clock common to each other and outputs the strings to the corresponding de-multiplexer.

6. A receiver apparatus for multiplexing transmission configured to receive multiplexed data in which transmission data on a plurality of input channels, each of which is configured to receive transmission data having frequency information different from frequency information of the other input channels, is multiplexed, comprising:

a de-multiplexer configured to divide a data string received via the transmission path into as many data flows as the input channels on a side of the transmitter apparatus;

a plurality of FIFOs configured to execute a process of restoring valid data from the corresponding data flows and storing the data in respective FIFO memories, and a process of reading the transmission data from the respective FIFO memories and outputting the data to the corresponding output channels; and a plurality of frequency controllers configured to execute a process of estimating transmission data rates from time average data rates of the respective corresponding data flow, and a process of adjusting the frequencies of clocks supplied to the corresponding FIFOs so as to be equal to the respective estimated transmission data rates.

7. The receiver apparatus for multiplexing transmission, according to claim 6, wherein the frequency controller is configured to acquire a difference between the frequency of the clock and the frequency of the transmission data rate on the basis of a unit time difference in data amount of the transmission data stored in the FIFO memory separately provided for the data flow, and to adjust the frequency of the clock such that the difference is zero.

8. The receiver apparatus for multiplexing transmission, according to claim 6, wherein a PLL circuit generating the clock comprises an N clock divider, an N−M clock divider, and an N+M clock divider configured to generate an N divided clock, an N−M divided clock, and an N+M divided clock, respectively, that are defined according to natural numbers N and M (where N>M), and the frequency controller is configured to adjust the frequency of the clock generated by the PLL circuit, by controlling spreading between a central clock in a frequency range defined by the N clock divider, an upper limit clock in the frequency range defined by the N−M clock divider, and a lower limit clock in the frequency range defined by the N+M clock divider.

9. A transmitter apparatus for multiplexing transmission that transmits multiplexed data via a transmission path, comprising:

a plurality of input channels, each of which is configured to receive transmission data having frequency information different from frequency information of the other input channels;

a plurality of block framers configured to divide transmission data, including valid data and invalid data, corresponding to the respective input channels into data blocks having a fixed length, as valid data, change a bandwidth in accordance with a band ratio of a band occupied by the valid data, smooth a ratio of valid data included in the data blocks corresponding to the data flow, and output the data blocks; and a multiplexer configured to multiplex the data blocks corresponding to the respective input channels and output multiplexed data to the transmission path.

10. The transmitter apparatus for multiplexing transmission according to claim 9, wherein the transmitter apparatus comprises: a plurality of the multiplexers corresponding to the respective transmission paths; and a selector configured to assign the data blocks corresponding to the respective input channels to the multiplexers.

* * * * *